United States Patent
Lemmer et al.

(10) Patent No.: US 10,099,297 B2
(45) Date of Patent: Oct. 16, 2018

(54) TOOL AND METHOD FOR MACHINING FIBER-REINFORCED MATERIALS

(71) Applicant: CemeCon AG, Würselen (DE)

(72) Inventors: Oliver Lemmer, Aachen (DE); Manfred Weigand, Aachen (DE); Michael Woda, Aachen (DE); Werner Pütz, Aachen (DE); Biljana Mesic, Aachen (DE)

(73) Assignee: CemeCon AG, Würselen (DE)

( * ) Notice: Subject to any disclaimer, the term of this patent is extended or adjusted under 35 U.S.C. 154(b) by 8 days.

(21) Appl. No.: 15/021,934

(22) PCT Filed: Sep. 12, 2014

(86) PCT No.: PCT/EP2014/069531
§ 371 (c)(1),
(2) Date: Mar. 14, 2016

(87) PCT Pub. No.: WO2015/036557
PCT Pub. Date: Mar. 19, 2015

(65) Prior Publication Data
US 2016/0228954 A1    Aug. 11, 2016

(30) Foreign Application Priority Data
Sep. 13, 2013 (DE) .................. 10 2013 218 446

(51) Int. Cl.
*B23B 51/02* (2006.01)
*B23B 51/00* (2006.01)
(Continued)

(52) U.S. Cl.
CPC ............ *B23B 51/009* (2013.01); *B23B 51/02* (2013.01); *B23C 5/16* (2013.01); *C23C 16/27* (2013.01);
(Continued)

(58) Field of Classification Search
USPC ................... 51/307, 309; 428/408; 407/119; 408/144
See application file for complete search history.

(56) References Cited

U.S. PATENT DOCUMENTS

| | | | |
|---|---|---|---|
| 5,648,119 A * | 7/1997 | Grab | B23B 27/145 407/117 |
| 6,007,281 A * | 12/1999 | Eriksson | B23B 35/00 408/1 R |

(Continued)

FOREIGN PATENT DOCUMENTS

| | | |
|---|---|---|
| CA | 2 367 184 A1 | 9/2001 |
| DE | 199 14 585 C1 | 9/2000 |

(Continued)

OTHER PUBLICATIONS

International Search Report, PCT/EP2014/069531 and translation, dated Dec. 16, 2014 (4 pages).

(Continued)

*Primary Examiner* — Archene A Turner
(74) *Attorney, Agent, or Firm* — Flaster/Greenberg P.C.

(57) ABSTRACT

A tool for machining fiber-reinforced materials, said tool having a tool body having a particular cutting edge that has at least a main function surface and has a diamond coating applied at least to said main function surface. In order to provide a tool and a method which are especially suitable for machining fiber-reinforced materials, the surface of the diamond coating has a reduced peak height Spk of less than 0.25 μm.

24 Claims, 3 Drawing Sheets

(51) Int. Cl.
  *B23C 5/16* (2006.01)
  *C23C 30/00* (2006.01)
  *C23C 16/27* (2006.01)
  *C23C 28/04* (2006.01)

(52) U.S. Cl.
  CPC .......... *C23C 28/046* (2013.01); *C23C 30/005* (2013.01); *B23B 2226/27* (2013.01); *B23B 2226/275* (2013.01); *B23B 2226/31* (2013.01); *B23B 2228/105* (2013.01); *B23B 2228/36* (2013.01); *B23B 2228/44* (2013.01); *B23C 2226/27* (2013.01); *B23C 2226/31* (2013.01); *B23C 2228/10* (2013.01)

(56) References Cited

U.S. PATENT DOCUMENTS

| | | | |
|---|---|---|---|
| 6,110,240 | A | 8/2000 | Saguchi et al. |
| 6,268,045 | B1 | 7/2001 | Leyendecker et al. |
| 6,547,494 | B2* | 4/2003 | Hanyu .................. B23C 5/10 407/119 |
| 6,761,516 | B2* | 7/2004 | Pham .................... B23B 35/005 408/1 R |
| 7,815,735 | B2 | 10/2010 | Breidt et al. |
| 9,039,336 | B2 | 4/2015 | Von Puttkamer et al. |
| 2006/0099422 | A1 | 5/2006 | Gussone et al. |
| 2006/0219158 | A1 | 10/2006 | Breidt et al. |
| 2008/0019787 | A1 | 1/2008 | Sampath et al. |
| 2009/0017258 | A1* | 1/2009 | Carlisle ................ C23C 16/271 428/143 |
| 2009/0026712 | A1* | 1/2009 | Kawanishi ................ F16J 9/26 277/443 |
| 2009/0173950 | A1* | 7/2009 | West .................... B81C 1/0015 257/77 |
| 2010/0003456 | A1 | 1/2010 | Joachim |
| 2013/0164557 | A1 | 6/2013 | Bareiss et al. |
| 2013/0252515 | A1* | 9/2013 | Shiroishi .................. B24B 1/00 451/41 |

FOREIGN PATENT DOCUMENTS

| | | |
|---|---|---|
| DE | 199 22 665 A1 | 11/2000 |
| DE | 202 11 592 U1 | 5/2004 |
| DE | 203 04 580 U1 | 9/2004 |
| DE | 20 2004 014 495 U1 | 11/2005 |
| DE | 10 2008 023 856 A1 | 11/2009 |
| JP | 2012-176471 A | 9/2012 |
| WO | WO 1998/035071 A1 | 8/1998 |
| WO | WO 2000/060137 A1 | 10/2000 |
| WO | WO 2004/031437 A1 | 4/2004 |
| WO | WO 2004/083484 A1 | 9/2004 |
| WO | WO2005118909 * | 12/2005 |
| WO | WO 2007/140931 A | 12/2007 |
| WO | WO 2011/135100 A1 | 11/2011 |
| WO | WO2012090540 * | 7/2012 |

OTHER PUBLICATIONS

International Preliminary Report on Patentability and Written Opinion, PCT/EP2014/069531 and translation, dated Mar. 15, 2016 (7 pages).

* cited by examiner

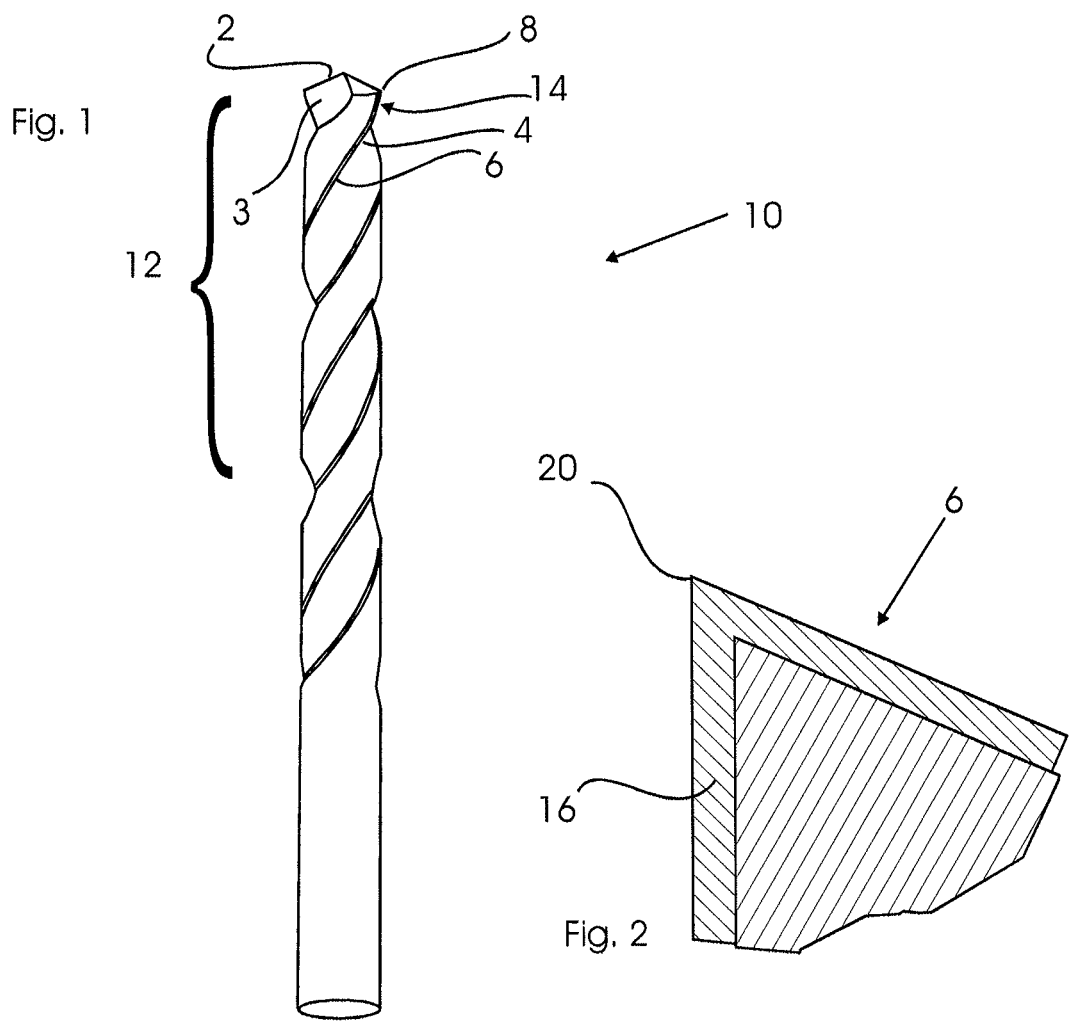
Fig. 1
Fig. 2
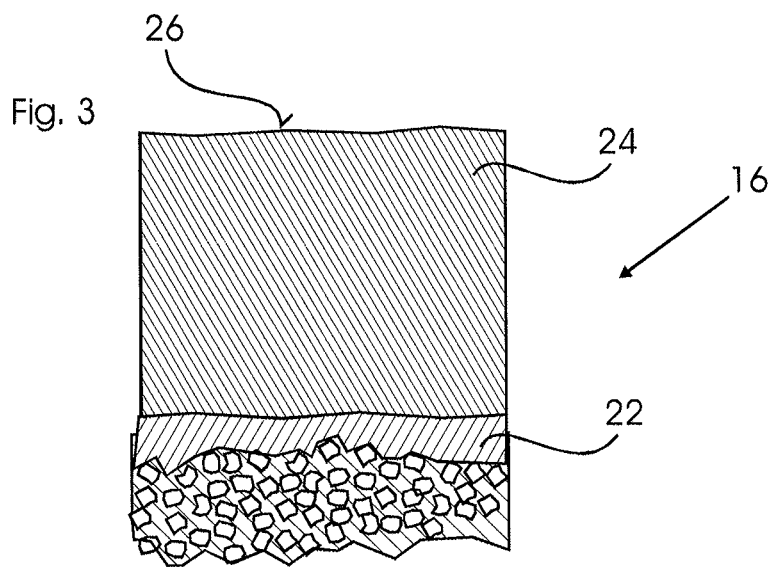
Fig. 3

TOOL AND METHOD FOR MACHINING FIBER-REINFORCED MATERIALS

BACKGROUND OF THE INVENTION

Field of the Invention

The invention relates to a tool and a method for machining fiber-reinforced materials.

Description of Related Art

In particular, the invention relates to the machining of fiber-reinforced composite materials, that is, such that consist of a composite of various materials, among these at least one fiber material. This relates in particular to fiber-reinforced, e.g. carbon fiber-reinforced, materials with a matrix, e.g. a plastic matrix (CFRP) or a carbon matrix (CFC).

Such materials are used in particular in lightweight construction because, despite weighing little, they are very strong. Accordingly, applications of fiber-reinforced materials are known in automotive construction, for sports materials, in medical technology, wind power, space flight, etc., in particular, however, in the aviation industry.

In this case the fiber-reinforced materials are often part of a sandwich material consisting of a plurality of individual layers, among these not only layers made out of fiber composites, but also metal layers made, in particular, out of aluminum alloys or titanium alloys.

The machining of such materials makes exceptionally high demands on cutting tools. Due to the considerable abrasiveness of the fibers, conventional cutting tools have only short service lives here. Particular problems become apparent during drilling when delamination or fraying of the drilling hole frequently occurs.

It is known to provide cutting tools with a diamond cutting edge. Known on the one hand are conventional diamond tools (PCD=polycrystalline diamond) with diamond inserts soldered onto the cutting edge. Further, even tools with complex tool geometries can be protected by means of the subsequent application of a diamond layer in the CVD (Chemical Vapor Deposition) process.

In WO 00/60137 a tool and a manufacturing method for this are described. A tool substrate is first pre-treated and provided with a diamond coating with two layers, which both have predominantly carbon in a diamond structure, in a CVD coating plant according to the hot-filament process, the first layer having a higher diamond content than the second layer. The coefficient of thermal expansion of the first layer is less than that of the substrate, and the coefficient of thermal expansion of the second layer is greater than the coefficient of thermal expansion of the first layer, in order to prevent cracks.

BRIEF SUMMARY OF THE INVENTION

The object of the invention is to provide a tool and a method, which are especially suitable for machining fiber-reinforced materials.

The object is solved by means of a tool according to claim 1, a use of the tool according to claim 12 and a machining method according to claim 13.

Dependent claims refer to advantageous embodiments of the invention.

The invention is based on the realization that, although tools with diamond coating applied to the cutting edge, in particular to the main function surface, such as those that can be produced in the CVD process for example, have properties favorable to the machining processing of many materials, however, as the inventors have realized, conventional diamond-coated tools cannot be used for machining fiber-reinforced materials without complications arising. During the processing, in particular during the drilling, the inventors have noticed delamination of the sandwich composite and torn-off fibers. According to the observations of the inventors, due to the hardness of the diamond layers, even relatively slight unevenness in the layer surface combined with the particular fiber structure of the material to be machined results in poor surfaces in the drilled hole, chatter marks as regards the cone or even the tool breakage.

According to the invention a tool is proposed as a cutting tool, which has a tool body with a geometrically defined cutting edge with at least a main function surface. Main function surfaces are surfaces which are directly adjacent to the cutting edges or cutting corners, in particular the cutting edges or cutting corners, which machine the greatest proportion of the volume of the workpiece. As regards a drill these are, for example, the surfaces which are adjacent to the cutting edges of the main cutting edges, such as the main flanks and their rake faces, also the chamfer of the secondary cutting edges or the guiding chamfers. The greatest machining performance occurs at the cutting corner.

According to the invention, a diamond coating is applied to at least a main function surface, preferably to the entire processing area of the tool, that is, of the part that processes the material to be machined in direct contact. This is preferably a CVD diamond layer, that is, a diamond layer produced directly on a tool substrate and adhering firmly thereto.

The diamond layer provided according to the invention has a particular topographical surface characteristic which is reflected in the areal roughness value Spk, in what is known as the 'reduced peak height'. Measured on the main function surface, or at least in an area of the main function surface, the areal roughness value Spk according to the invention is less than 0.25 μm.

As regards the defined reduced peak height Spk according to EN ISO 25178 this is a surface value which especially takes into account upwardly protruding roughness peaks of an otherwise plateau-like surface, but not depressions like deeper-lying grooves, roughness valleys, etc. Surprisingly, it has turned out that tools with a geometrically defined cutting edge, as regards which a diamond coating with a surface topology according to the invention is applied to the main function surface, have considerable advantages for the machining of fiber-reinforced materials. The surface structure of the diamond coating according to the invention has outgrowths or relatively large individual crystals, which, expressed in numbers by the parameter of the reduced peak height Spk, scarcely protrude outwards. In operational tests it has become apparent that tools with such a coated cutting edge offer considerable advantages, in particular much enhanced service lives and cleaner drilled holes.

At least one measuring point on at least one main function surface is taken into account to determine this surface topology. Preferred measuring points for determining the aforementioned roughness value are the portions of the surface adjacent to the cutting corner, in particular of the first main flank and/or of the chamfer of the secondary cutting edge. For measuring purposes, the values are preferably taken on the horizontal drill, on the portion of the surface of the chamfer of the secondary cutting edge, which is immediately adjacent to the cutting edge. Since these portions of the surface are very close to each other, hardly any deviations in the layer morphology and roughness result. One advantage of determining the Spk value is that this is largely independent of the measuring surface and can also be taken on small pieces of surface.

Based on the inventors'' considerations individual, protruding outgrowths or relatively large individual crystals of an otherwise smooth diamond layer are probably responsible for a poor machining surface in fiber-reinforced materials, in particular CFRP materials, because they might possibly cause fibers to be pulled out. In contrast to conventional tool materials and even compared to other known hard material coatings on tool cutting edges, due to its extremely great hardness, a diamond layer evidently behaves differently when used, since, unlike other materials, it does not become smooth immediately. Fibers from the processed, fiber-reinforced material, which are present on the walls of a drilled hole for example, can get caught on the protruding peaks of a diamond layer and thus cause upswing during drilling for example. In particular during lowering, this can lead to very unclean, non-round depression surfaces. If an outgrowth is pulled out of a diamond layer, this can cause the layer and therefore the tool to fail completely.

In contrast, the tool according to the invention, in which protruding peaks and other outgrowths, which scarcely protrude from the surface, are present, is characterized by considerably fewer vibrations during drilling, such as those which, as regards conventional tools, become noticeable in the form of chatter noises and squeaking noises, depending on rotation speed. Here the fundamental advantages of diamond-coated tools are maintained, in particular the good resistance to the abrasion of the fibers and little tendency to stick or adhere with regard to the plastic matrix or the metal layers.

These advantages become apparent even with the reduced peak height Spk of less than 0.25 μm according to the invention. The advantages become still clearer with even lower Spk values of less than 0.2 μm, most preferably of less than 0.15 μm.

Other roughness parameters, such as the mean roughness $R_a$ or the roughness depth $R_z$ show no unequivocal connection with the processing characteristics or respectively have far less impact. Thus, according to the inventors'' observations it does not depend predominantly on providing a completely smooth diamond layer, but rather on preventing the peaks previously described and other protruding areas, which are reflected in the Spk value.

And yet, in embodiments of the invention the areal roughness can moreover definitely be accepted with higher values, expressed, for example, in the roughness parameter of the roughness depth $R_z$. For example, very good results for the machining of fiber-reinforced materials can still be achieved with a diamond coating on the main function surface, which has a roughness depth $R_z$ of 0.4 μm or more yet, at the same time, the low reduced peak height according to the invention. The effect according to the invention is even achieved with greater roughness depths $R_z$ of 0.7 μm or more, or even 1.2 μm or more, just as long as the Spk value is low in accordance with the invention.

The advantages of the invention can be achieved in the case of various types of tool with a particular cutting edge, in particular as regards milling cutters, indexable inserts, etc. The invention has proved particularly advantageous as regards drilling tools. The respective main function surface under consideration there is a surface immediately adjacent to a main cutting edge or secondary cutting edge. The main function surface is most preferably arranged directly on a cutting edge, for example on the chamfer of the secondary cutting edge directly below the cutting corner.

Special advantages can be achieved as regards conical drills or respectively step drills. Conical drills or step drills have a first drilling area with a smaller diameter and second drilling area with a larger diameter. As regards conical drills, the workpiece is drilled through with the first drilling area and then a depression, for example for a rivet, achieved with the second drilling area. Here the transition between the drilled hole and the depression proves particularly critical. The processing of the workpiece here must be especially clean, to produce a transition with a defined radius or a chamfer. Otherwise there is a risk of what is known as "head dishing" during which the rivet is deformed and becomes dented. Micro-cracks can arise in the rivet head and, at worst, the riveted joint fails.

Conical drills with no coating soon wear out in the area of transition between the first and second drilling area so that before long the intended clean transition is no longer ensured. Even conical drills with a conventional CVD diamond coating can show unevenness in the critical area of transition. In contrast, less wear is evident as regards conical drills which have a diamond coating with the low reduced peak height according to the invention, so that the desired processing quality in the transition remains ensured for longer. Here the surface characteristics according to the invention are especially important in the area of the transition between the steps, that is, for example, on the rake faces and flanks of the cutting edges of the second step and on the guiding chamfer at the end of the first step.

According to a preferred embodiment of the invention, the diamond coating has at least one layer made out of nanocrystalline diamond. This is defined as diamond with a crystallite size (grain size) in the nanometer range, that is, in contrast to microcrystalline structures, less than 1 μm. The layer made out of nanocrystalline diamond preferably has crystallite sizes of 500 nm or less, more preferably of 200 nm or less, most preferably of 100 nm or less. The outer surface of the diamond coating is most preferably formed of a layer of nanocrystalline diamond, so that the topology of the surface can easily be adjusted to the low Spk value according to the invention.

The diamond coating is preferably formed out of a sequence of at least two different layers. Both layers are preferably diamond layers, albeit with a different structure. For example, one layer made out of microcrystalline diamond and one layer made out of nanocrystalline diamond can be provided. Equally possible is a sequence of layers with more than two layers (multi-layer), e.g. of alternating microcrystalline and nanocrystalline layers.

According to a particularly preferred embodiment a first layer is provided, which adjoins the surface of the tool body and consists of crystalline diamond, and onto which a second layer of diamond located further outside is applied, which has a smaller grain size than the first layer. In particular, nanocrystalline diamond in the second layer located outside is particularly preferred, in order to form the smooth surface with low Spk value. The first larger-grained crystalline diamond layer near the substrate has proved favorable in terms of layer adhesion.

However, the first crystalline layer also has an increased areal roughness due to the larger grain size in general. Therefore it has proven further advantageous to have the layer thickness of the second layer greater than the layer thickness of the first layer, preferably considerably greater in particular. Hence the layer thickness of the second layer for example can be more than double, preferably 10-fold or more, most preferably 25-fold or more the layer thickness of the first layer. Thus the first diamond layer, which is preferably in direct contact with the tool substrate, substantially forms a relatively thin transition layer, of which the roughness is limited due to the slight thickness and which ensures a good layer adhesion, while the second, preferably nanocrystalline, diamond layer can form the smooth outer surface which is predominantly free from protruding peaks, and whereby the wear-protection volume is essentially provided by this layer, due to the considerably greater thickness of the second layer.

For example, the first layer can have a layer thickness in the range of 0.3-1.5 µm. Further preferably the layer thickness of the first layer is at most 1.4 µm, particularly preferably at most 1 µm. Good results in terms of layer adhesion were achieved thereby, while the roughness introduced by the first layer due to the slight thickness, was still acceptable.

The overall layer thickness of the diamond coating can be in the range of 3-30 µm for example. Although, on the one hand, a particular wear-protection volume is advantageous, on the other, the roughness can increase with greater layer thicknesses, so that the Spk values can also be greater. Therefore a relatively narrow choice has proven advantageous for the special purpose of the tools according to the invention; indeed, according to a further embodiment of the invention, the overall layer thickness is at least 6 µm. Further preferred are overall thicknesses of at least 7, most preferably of at least 8 µm. The proposed upper limit of the overall thickness is 12 µm, further preferably 11 µm and most preferably 10 µm, not least to prevent the growing roughness of the surface by means of the limitation. Hence, according to the findings at present, a layer thickness in the relatively narrow range of 7-12 µm has proven most favorable in order to provide a tool especially suitable for machining fiber-reinforced materials, which offers sufficient wear-protection volume on the one hand and yet can still be produced with a smooth surface.

Moreover, the diamond-coated tool according to the invention is especially suitable for processing sandwich materials, in the case of which at least one layer consists of a fiber-reinforced material, in particular of a fiber composite material, and which further have a metal layer, in particular titanium alloys or aluminum alloys. Due to its great hardness, the diamond layer has both sufficient resistance to the abrasiveness of the fibers and good processing characteristics for the metal layer.

In the case of the processing of sandwich materials, in which at least one metal layer consists of a titanium alloy or aluminum alloy, an increased overall layer thickness of the diamond coating is preferred. For example, for sandwich materials with a metal layer made out of an aluminum alloy, it has become apparent that a layer thickness increased by approx. 2 µm, even by approx. 4 µm in the case of a titanium alloy, is advantageous with respect to purely CFRP processing. Both materials can cause smearing on the tool surface. Moreover, a titanium alloy in particular increases the cutting forces and temperatures during machining. The layer strength can be increased still more, for example by 8 µm, for especially long service lives and/or particularly wear sensitive materials. If, on the application of the diamond layer, the Spk values become too high, the layer can be processed subsequently if necessary.

The surface topology according to the invention is achieved by a correspondingly targeted application of the production method, in particular hot-filament CVD. All process steps, proceeding from the pre-treatment of the substrate up to the application of the coating, should be carried out so carefully and in such a controlled manner that the intended Spk values are not exceeded in the end. Hence during the pre-treatment of the substrate for example, the etching depth can be limited in an etching process. Smoother layers can be produced, by dispensing with a blasting process. During the application of the coating, the production of a surface with low Spk values can be achieved at the expense of the layer rate, for example by means of a lower process temperature in the coating process. This can be achieved by a reduction of the filament performance in the hot filament process or preferably by changing the positioning of the tool substrates to be coated relative to the filaments. Since checking the surface topology achieved in the end is easily possible, a suitable process according to such conditions can respectively be carried out for very different tools.

In the case of a tool suitable for machining sandwich materials with metal layers made out of titanium alloys or aluminum alloys, a somewhat greater roughness is set during the chemical pre-treatment. In the case of titanium, it has proven advantageous if, additionally, the substrate is also gently sand-blasted before the chemical pre-treatment. Both measures might possibly increase the layer roughness or the Spk value to a certain extent, so that, during any subsequent process steps, particular attention must be paid to not exceeding the intended Spk value of the finished tool.

BRIEF DESCRIPTION OF THE SEVERAL VIEWS OF THE DRAWINGS

In the following an embodiment of the invention is described in greater detail with reference to drawings. In the figures:

FIG. 1 shows a side view of a drill;

FIG. 2 shows an enlarged illustration of a cross-section through a cutting edge and a main function surface of the drill from FIG. 1;

FIG. 3 shows a schematic illustration of the structure of a coating of the main function surface from FIG. 2;

DETAILED DESCRIPTION OF THE INVENTION

Figure 4A:
FIGS. 4a, 4b show exemplary roughness profiles to explain roughness parameters.

FIG. 1 shows a side view of a drill 10 as an example of a tool according to an embodiment of the invention. The drill 10 has a processing area 12 with various cutting edges 20, main cutting edges 2 arranged at the tip and, adjoining this, a spiral area with secondary cutting edges 4. The outer ends of the main cutting edges 2 form cutting corners 8.

Rake faces 3 are adjacent to the main cutting edges 2. Chamfers 6 are formed on the secondary cutting edges 4.

The drill 10 consists of a hard metal material, in particular a WC/Co hard metal, and is coated with a diamond coating 16 in its processing area 12.

Surfaces which are adjacent to the cutting edges 20 are described as main function surfaces of the drill 10. Hence the chamfers 6 of the secondary cutting edges 4 constitute main function surfaces of the drill 10, which are directly adjacent to the cutting edge 20. Likewise, the rake faces 3 on the main cutting edges 2 constitute main function surfaces of the drill 10.

FIG. 2 shows a schematic illustration of a cut through a cutting edge 20 with a diamond coating 16. The cutting edge 20 can be, for example, a main cutting edge or secondary cutting edge 2, 4. For example, in the case of the secondary cutting edge 4, the chamfer 6 of the secondary cutting edge directly adjacent to the cutting edge 20 forms a main function surface of the drill 10.

FIG. 3 shows a schematic illustration of the structure of the diamond coating 16 on the main function surface 6 shown in FIG. 2. In the example shown, this has two layers. First, a first diamond layer 22 made out of microcrystalline diamond is applied to the WC/Co hard metal substrate. A second diamond layer 24 made out of microcrystalline diamond is applied directly onto the first diamond layer 22. The second diamond layer 24 is considerably thicker than the first diamond layer 22.

The outer surface 26 of the diamond coating 16 is formed by the nanocrystalline second diamond layer 24. The surface 26 has a very smooth structure, whereby there are no upwardly protruding peaks, outgrowths or relatively large individual crystals on the surface in particular.

The topology of the surface 26 can be characterized by standardized roughness parameters, here the areal roughness value of the "reduced peak height," in short Spk, in particular. The areal roughness value of the reduced peak height Spk is standardized according to EN ISO 25178. The "reduced peak height" is a surface value which, in particular, takes into account upwardly protruding roughness peaks on an otherwise plateau-like surface, not, however, deeper-lying grooves or respectively roughness valleys.

Figure 4B:
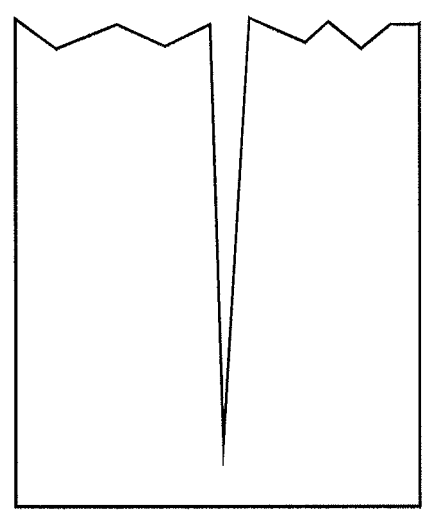

When assessed, the parameter of the reduced peak height differs considerably from roughness parameters which merely describe the roughness or respectively smoothness of a surface in general, without evaluating protruding peaks in particular. The illustrations in FIGS. 4a, 4b show a symbolic example of two roughness profiles which are inverse to each other, with a peak protruding in the center in FIG. 4a and, inverse to this, a central valley in FIG. 4b. The value of the roughness depth $R_z$ is identical for both profiles in FIGS. 4a, 4b. In contrast, the topology of the profile in FIG. 4b appears considerably more favorable for processing fiber-reinforced materials, since a protruding peak as shown in FIG. 4a is more likely to cause fibers to be torn out during the processing of fiber-reinforced materials, for example CFRP materials.

The parameter of the reduced peak height according to EN ISO 25178 takes this into account. The value can be easily determined with today's optical 3D roughness-measuring devices. The value of the two-dimensional reduced peak height Rpk is defined according to ISO 13565-2. In a preferred calculation method for the Spk value this is calculated identically, albeit on the basis of the surface material curve instead of the material curve which is developed from an individual profile section. For this, the ISO 25178 standard is used.

When assessing exemplary embodiments of the invention, the surfaces were determined with an optical 3D measuring device "µsurf explorer" from the company Nano Focus AG. The Spk value is calculated as described above via the related "µsoft analysis" software. The form of the tool was taken into account for measuring with a second-order polynomial. The analysis is preferably done on the chamfer 6 of the secondary cutting edge 4, directly below the cutting corner 8. This point is marked by the reference number 14 in FIG. 1.

Due to the smooth surface 26 on the main function surface 6, which is largely free of protruding peaks and outgrowths, the drill 10 is very suitable for processing carbon fiber-reinforced matrix materials like CFRP and CFC in particular.

Figure 6:
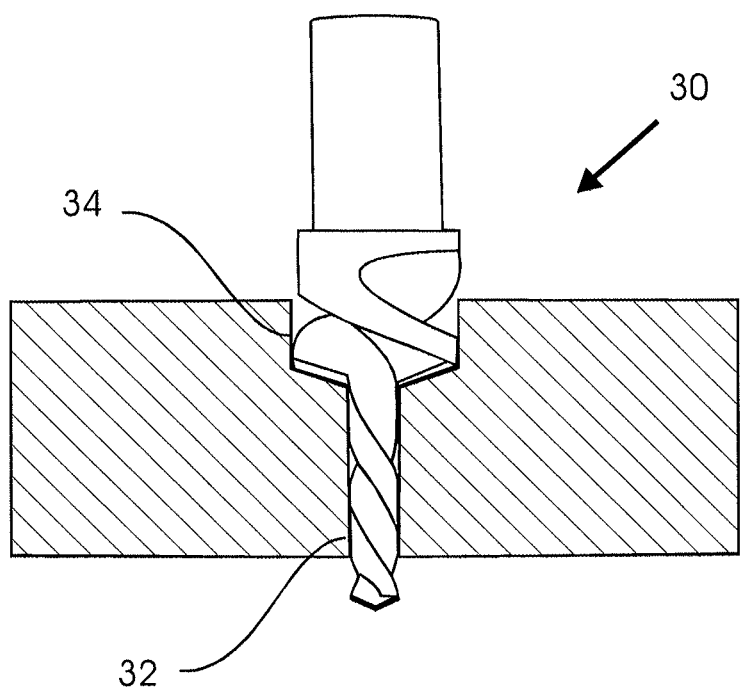
FIG. 6 shows a partly cutaway side view of a step drill in a workpiece.

FIG. 6 shows a step drill (conical drill, countersink) 30 with a first drilling area 32 of smaller diameter and a second drilling area 34 of larger diameter. As shown in schematic form in FIG. 6, the conical drill 30 can be used for producing depressions in a workpiece.

Figure 5A:
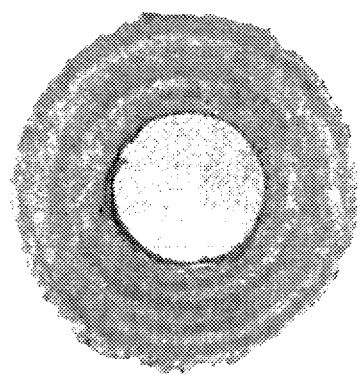
FIGS. 5a, 5b show images of drilled holes, which were created with a tool according to an embodiment of the invention and with a comparable tool.
Figure 5B:
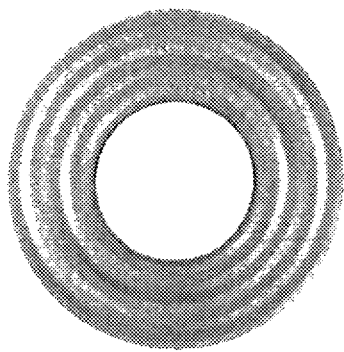

FIG. 5b shows an example of drilled rivet holes produced with a countersink, wherein the main function surface has the surface topology described above, with an Spk value of 0.12 µm. For the purposes of comparison, a drilled rivet hole produced under the same conditions with a conventional CVD diamond-coated tool is shown in FIG. 5a. Measured on the surface of the coating on the main function surface, the Spk value of the conventional, comparable tool is 0.3 µm.

Even during drilling it becomes apparent that the tool with the smooth surface with a low Spk value runs smoothly, whereas the conventional, comparable tool undergoes considerable vibrations. When the drilled holes are assessed, a clean drilled hole is evident in the case of the smooth surface of the coating, whereas the conventional tool shows unclean, non-round depression surfaces in the CFRP sandwich material, due to an interaction between the carbon fibers contained therein and protruding peaks on the coating.

The application of the coating 16, which in the example shown consists of the diamond layers 22, 24, is carried out in an exemplary embodiment as a CVD diamond coating in the hot-filament process, following pre-treatment of the hard metal substrate.

In this case the hard metal substrate is first chemically and/or electrochemically etched during the pre-treatment. The pre-treatment serves to remove the cobalt harmful to the diamond growth and the layer adhesion. Additionally, it can serve to remove the grinding skin and/or to roughen the surface for improved adhesion by means of a mechanical grouting between layer and substrate. Suitable pre-treatment methods are described in particular in WO 2004/031 437 A1 and in WO 2007/140 931 A1 of the applicant. A treatment by means of sand-blasting to condition the surfaces can take place beforehand.

During the subsequent CVD diamond coating by means of the hot-filament process, the tools are preferably positioned between two parallel rows of vertical filaments, as described in WO 98/35071 of the applicant. The two diamond layers 22, 24 can be produced by predefining various parameters of the coating plant during the coating process, as described in WO 00/60137 A1 of the applicant for example. A nanocrystalline structure of the outer layer 24 can be produced by means of a coating process, which, using its process parameters, commutes between conditions of variously intense carbon supersaturation according to WO 2004/083 484 A1 of the applicant.

The particular topology of the surface becomes thereby possible due to the particularly smooth diamond layers produced with the method given in WO 2004/083 484 A1, which even cause a levelling of the somewhat rougher microcrystalline diamond layer 22 lying beneath it. The chemical etching described above is only carried out gently with little etching depth beforehand, in order to obtain a relatively smooth substrate. The smooth surface 26 is further aided by the structure of the diamond coating 16 made out of a first diamond layer 22 of relatively slight thickness and a considerably thicker nanocrystalline diamond layer 24 lying over it. The overall layer thickness is thereby limited to 12 µm at the most for example, most preferably to a minimum of 8 and a maximum of 10 μm. With a correspondingly slight layer thickness a smooth surface 26 with the required low Spk value can even be achieved during the production in the CVD process.

Additionally or alternatively, the surface 26 can be subsequently processed, in order to provide the desired roughness parameters. The subsequent processing can be carried out with diamond tools or respectively diamond grinding discs or by means of a plasma smoothing or respectively laser smoothing.

EXAMPLES

An 8 mm drill made out of EMT 100 hard metal having 6 wt % Co is first electrochemically etched and 6 μm uniformly removed. Then a particularly gentle chemical pre-treatment is carried out, as described in WO 2004/031 437 A1, which reduces the cobalt near the surface and causes a slight roughness. This pre-treatment reduces the diameter of the drill by a further 2 μm. Next, a 0.3 μm-thick crystalline layer is applied by means of the hot-filament process in a coating plant type CC800/9 Dia. Finally, the coating parameters are modified in the same process, without vacuum interruption, so that a nanocrystalline layer is applied up to an overall layer thickness of 8 μm by means of a process which commutes between various operating conditions according to WO 2004/083 484 A1.

Produced in this way, the tool shows an increased number of holes compared to conventional, CVD diamond-coated tools, when drilling rivet holes in a CFRP material, the drilling quality being considerably enhanced compared to conventional processing, during which frayed fiber ends are visible in the bore hole, as is apparent in the comparison of the illustrations FIGS. 5a, 5b.

In a further example an 8 mm drill is produced, which proceeds from the same tool substrate as in the first example. In order to be able to machine sandwich materials with at least one metal layer made out of an aluminum alloy with said tool, a somewhat deeper etching is carried out during a production process otherwise the same as the one described above. The result is therefore better layer adhesion, even though the roughness is perhaps increased. In this case 3 μm is removed during the chemical pre-treatment. The overall layer thickness of the diamond coating is 10 μm, somewhat more than in the case of the above tool which is provided above all for purely CFRP processing.

In a further example of a drill for processing sandwich materials with a metal layer made out of a titanium alloy, the production is carried out as described above for the aluminum-sandwich tool, although the substrate is additionally treated by means of sand-blasting beforehand. In this case the overall layer thickness is even a little more, 12 μm, so that better characteristics for machining the titanium material are achieved.

We claim:

1. A tool for machining fiber-reinforced materials, with a tool body with a particular cutting edge with at least a main function surface,
and a diamond coating applied at least to the main function surface,
wherein the surface of the diamond coating has a reduced peak height Spk of less than 0.25 μm.

2. The tool according to claim 1, wherein
the surface of the diamond coating has a reduced peak height Spk of less than 0.2 μm.

3. The tool according to claim 1, wherein
the surface of the diamond coating has a roughness depth $R_z$ of 0.4 μm or more.

4. The tool according to claim 1, wherein
the diamond coating has at least one layer made out of nanocrystalline diamond.

5. The tool according to claim 1, wherein
the diamond coating is formed out of at least two different layers.

6. The tool according to claim 5, wherein
the diamond coating comprises a first layer which adjoins the surface of the tool body and consists of crystalline diamond,
and, located further outside, a second layer made out of diamond with a grain size that is less than the grain size of the first layer.

7. The tool according to claim 6, wherein
the layer thickness of the second layer is greater than the layer thickness of the first layer.

8. The tool according to claim 1, wherein
the diamond coating has an overall layer thickness which is at least 6 μm.

9. The tool according to claim 1, wherein
the diamond coating has an overall layer thickness which is at most 12 μm.

10. The tool according to claim 1, wherein
the tool body consists of a hard metal at least at the cutting edge.

11. The tool according to claim 1, wherein the tool is a drilling tool and the main function surface is a surface adjacent to a main cutting edge or secondary cutting edge.

12. A use of a tool according to claim 1 for machining fiber-reinforced materials.

13. A method for machining fiber-reinforced materials, wherein a tool according to claim 1 is used for machining.

14. The method according to claim 13, wherein
a sandwich material is machined with the tool
wherein the sandwich material has at least one layer made out of a fiber composite and at least one layer made out of a metal alloy.

15. The method according to claim 14, wherein
the metal alloy is a titanium alloy or aluminum alloy.

16. The tool according to claim 1, wherein
the surface of the diamond coating has a reduced peak height Spk of less than 0.15 μm.

17. The tool according to claim 1, wherein
the surface of the diamond coating has a roughness depth $R_z$ of 0.7 μm or more.

18. The tool according to claim 1, wherein
the surface of the diamond coating has a roughness depth $R_z$ of 1.2 μm or more.

19. The tool according to claim 6, wherein
the second layer consists of nanocrystalline diamond.

20. The tool according to claim 7, wherein
the layer thickness of the second layer is 25-fold or more the layer thickness of the first layer.

21. The tool according to claim 7, wherein
the diamond coating has an overall layer thickness which is at least 7 μm.

22. The tool according to claim 21, wherein
the diamond coating has an overall layer thickness which is at least 8 μm.

23. The tool according to claim 9, wherein
the diamond coating has an overall layer thickness which is at most 11 μm.

24. The tool according to claim 23, wherein the diamond coating has an overall layer thickness which is at most 10 μm.

* * * * *